United States Patent [19]
Kamei et al.

[11] Patent Number: 5,429,729
[45] Date of Patent: Jul. 4, 1995

[54] SPUTTERING APPARATUS, DEVICE FOR EXCHANGING TARGET AND METHOD FOR THE SAME

[75] Inventors: Mitsuhiro Kamei; Eiji Setoyama, both of Hitachi, Japan

[73] Assignee: Hitachi, Ltd., Tokyo, Japan

[21] Appl. No.: 616,868

[22] Filed: Nov. 21, 1990

[30] Foreign Application Priority Data

Nov. 29, 1989 [JP] Japan .................. 1-307719

[51] Int. Cl.6 .......................... C23C 14/34
[52] U.S. Cl. ................ 204/192.12; 204/298.09; 204/298.19; 204/298.22; 204/298.26
[58] Field of Search ............ 204/192.12, 298.09, 204/298.15, 298.19, 298.2, 298.22, 298.23, 298.25, 298.26, 298.27

[56] References Cited

U.S. PATENT DOCUMENTS

| | | | |
|---|---|---|---|
| 3,521,765 | 7/1970 | Kaufman et al. | 204/298.25 X |
| 4,274,936 | 6/1981 | Love | 204/298.25 X |
| 4,299,678 | 11/1981 | Meckel | 204/298.12 X |
| 4,415,427 | 11/1983 | Hidler et al. | 204/298.12 X |
| 4,547,279 | 10/1985 | Kiyota et al. | 204/298.12 X |
| 4,674,621 | 6/1987 | Takahashi | 204/298.25 X |
| 4,749,465 | 6/1988 | Flint et al. | 204/298.25 |

FOREIGN PATENT DOCUMENTS

| | | |
|---|---|---|
| 0262969 | 12/1985 | Japan ................ 204/298.26 |
| 61-576 | 1/1986 | Japan . |
| 61-133378 | 6/1986 | Japan . |
| 63-143261 | 6/1986 | Japan . |
| 61-210178 | 9/1986 | Japan . |
| 62-20873 | 1/1987 | Japan . |
| 62-127471 | 6/1987 | Japan . |
| 1-73074 | 3/1989 | Japan . |
| 1-165770 | 6/1989 | Japan . |
| 1-290767 | 11/1989 | Japan . |

OTHER PUBLICATIONS

J. Vossen et al., "Thin Film Processes", Academic Press, 1978, pp. 41–42.

*Primary Examiner*—Nam Nguyen
*Attorney, Agent, or Firm*—Antonelli, Terry, Stout & Kraus

[57] ABSTRACT

In accordance with the present invention, in order to exchange a target under a vacuum condition without communicating a film-forming chamber with the atmosphere for exchange of the target, a substrate is located in a vacuum vessel and an opening portion is provided on a wall surface of the vacuum vessel opposite to the substrate which is formed with a thin film on its surface. A target exchanging chamber is disposed adjacent to the vacuum vessel so as to be communicated therewith through the opening portion. During film-formation, the interior of the vacuum vessel is maintained in a vacuum state by closing the opening portion with the target while the target exchanging chamber is communicated with the atmosphere and a spare target is contained therein. When exchanging the target, the air in the target exchanging chamber is exhausted to maintain the chamber in a vacuum state and the target is replaced with the spare target.

11 Claims, 8 Drawing Sheets

SPUTTERING APPARATUS, DEVICE FOR EXCHANGING TARGET AND METHOD FOR THE SAME

BACKGROUND OF THE INVENTION

The present invention relates to a sputtering apparatus, and a device for exchanging a target and a method for the same. In particular, it relates to a sputtering apparatus suitable for use as an in-line sputtering apparatus for mass production in which a target is frequently exchanged, and to a device for exchanging the target and a method for the same.

A demand for means which may forms various materials into thin films, Such as a sputtering apparatus, has become greater in various kinds of fields. A sputtering method by this sputtering apparatus is such that argon gas or the like is discharged in a vacuum environment of approximately $10^{-1}$ to $10^{-4}$ Torr so as to generate ions for sputtering a target and scattered sputtered particles are accumulated to form a thin film on a surface of a substrate located opposite to the target. Various types of sputtering apparatus employing this principle has been invented and put into practical use.

Particularly, in an in-line sputtering apparatus for mass production, such method is employed that in order to form thin films, each having a predetermined thickness, of plural materials, strength of electric power supplied to targets is regulated to match with each material. According to this method, however, a specific target is often severely consumed so that it must be frequently exchanged. Because a vacuum state of the apparatus is broken every time the target is exchanged, a long period of time for the re-startup of the apparatus is required. Also, a quality of a thin film is unfavorably influenced, which results in a problem that a high quality film cannot always be obtained. Generally, in an in-line sputtering apparatus, such method is employed in such a way that a plurality of targets made of the same kind of material are given for a process while a substrate is being transferred in order to consume the targets as equally as possible. For example, in case of film formation of a magnetic recording disk, a sputtering apparatus continuously forms films on the disk, making use of nearly twenty target electrodes in all for a metallic film, a magnetic film and a protection film. However, when the number of the used targets is increased, an interval of time required for exchanging the targets becomes too long to be neglected and it is the greatest factor to decrease the activity rate of the sputtering apparatus. Particularly, since the film-forming chamber is communicated with the atmosphere during exchanging the targets, a period of re-startup time of the apparatus is not only longer, but preferable films cannot be also obtained as the qualities of the films are unfavorably influenced.

As disclosed in Japanese Patent Unexamined Publication No. 1-165770, such method has already been proposed that a target electrode portion is formed into a unit and the unit is securely attached on a film-forming chamber just by means of a handle or the like, whereby it is made possible to substantially reduce the time for exchanging the target electrode.

Further, as a method for exchanging an adhesion-preventing plate and so on in a film-forming chamber of a sputtering apparatus without communicating with the atmosphere, there is one method as follows.

Disclosed in Japanese Patent Unexamined Publication No. 61-133378 or No. 61-210178 is such method that an adhesion-preventing plate in a film-forming chamber is transferred by an appropriate transfer means to a supply/take-out chamber separated from the film-forming chamber by a gate valve or the like so as to be exchanged in this supply/take-out chamber, and a new adhesion-preventing plate is returned to the film-forming chamber again, whereby the adhesion-preventing plate can be exchanged without communicating the film-forming chamber with the atmosphere. Also, Japanese Patent Unexamined Publication No. 62-20873 or No. 62-127471 discloses such method that in case of exchanging a window glass, the window glass can be exchanged without communicating the film-forming chamber with the atmosphere, by separating a space for exchange of the window glass from the film-forming chamber with a gate valve.

As noted in Japanese Patent Unexamined Publication No. 61-576 which concerns a sputtering apparatus for multilayer film formation, but not an in-line sputtering apparatus, the sputtering apparatus for multilayer film formation is arranged in such a manner that a main chamber is provided with sub-chambers whose number corresponds to that of targets and the main chamber is separated from the sub-chambers by gate valves so that each target is not contaminated during sputtering the other targets.

In the above-described method disclosed in Japanese Patent Unexamined Publication No. 1-165770, the film-forming chamber is communicated with the atmosphere during exchanging the target electrode, which is the greatest factor to decrease a productivity and reliability of the apparatus.

On the other hand, all methods disclosed in Japanese Patent Unexamined Publication Nos. 61-1333378, 61-210178, 62-20873 and 62-127471, are restricted to only exchange of the adhesion-preventing plate and the window glass and cannot be applied to a process of exchanging the target electrode. Further, in a method to utilize a gate valve and an exchanging chamber for the purpose of enabling the target electrode to be exchanged in a vacuum, the gate valve is contaminated by sputtering the target electrode so that the film-forming chamber has to be communicated with the atmosphere to wash the gate valve after all. Moreover, in the method to separate the film-forming chamber from the target electrode by the gate valve in order to form a multilayer film without contaminating each target by the other targets, as explained in Japanese Patent Unexamined Publication No. 61-576, it is possible to exchange the target without communicating the film-forming chamber with the atmosphere, whereas similarly to the above-mentioned other publicly-known instances, it becomes necessary to exchange or wash the gate valve so that the film-forming chamber ,has to be communicated with the atmosphere. In addition, since a structure of the film-forming chamber is complicated and the distance between the target and the substrate is enlarged, such method causes a problem that a film having a favorable property cannot be obtained.

That is to say, in an in-line sputtering apparatus for mass production, a longer period of re-startup time of the apparatus leading to a decrease in an activity rate of the apparatus and an unfavorable influence on the film quality, all of which are resulted from communicating the film-forming chamber with the atmosphere for exchanging thee target, is not fully examined as an impor-

SUMMARY OF THE INVENTION

In view of the above-described problems, it is one object of the invention to provide a sputtering apparatus in which a target electrode can be exchanged in a vacuum without communicating a film-forming chamber with the atmosphere for exchange of the target, a device for exchanging a target and a method for the same, and further an in-line sputtering apparatus which does not require re-startup time of the apparatus so that an activity rate thereof is significantly increased.

In order to achieve the aforesaid object, the invention provides: a sputtering apparatus in which a vacuum vessel is provided with an opening portion on its wall face on the side opposite to a substrate disposed in the vacuum vessel and formed with a thin film on its surface, a target exchanging chamber communicating with the vacuum vessel through the opening portion is provided adjacently to the vacuum vessel, the opening portion is sealed with a target during film formation so as to maintain the vacuum vessel in a vacuum state, and the target exchanging chamber is evacuated to be maintained in a vacuum state during exchanging the target, whereby the target is exchanged for a spare target; a sputtering apparatus in which a vacuum vessel is provided with an opening portion on its wall face on the side opposite to a substrate, the opening portion is sealed with a target during film formation, and a target exchanging chamber is provided adjacently to the vacuum vessel in such a manner that one part of the target exchanging chamber is located at the opening portion of the vacuum vessel, and the target exchanging chamber receiving a spare target therein is communicated with the atmosphere during film formation and evacuated to be maintained in a vacuum state during exchanging the target; a target exchanging device including a target exchanging chamber provided adjacently to a film-forming chamber which comprises a vacuum vessel, a substrate disposed in the vacuum vessel and formed with a thin film on its surface and a target which is located opposite to the substrate and which is a base material for film formation, wherein the target exchanging chamber is provided with target transfer rails, and is separated from the film-forming chamber by the target and communicated with the atmosphere during film formation, and then evacuated so as to communicate with the film-forming chamber in a vacuum state during exchanging the target; a method for exchanging a target forming one part of a vacuum vessel during film formation, in which a target exchanging chamber provided adjacently to the vacuum vessel is evacuated into a vacuum state before the target forming one part of the vacuum vessel is exchanged for a spare target previously received in the target exchanging chamber; and an in-line sputtering apparatus including a supply chamber which is evacuated after a substrate is supplied therein in a state that the interior thereof is communicated with the atmosphere, a heating chamber for heating the substrate transferred from the supply chamber by a transfer mechanism after evacuating the supply chamber, in order to discharge gas from the substrate by a heater provided in the heating chamber, a cleaning chamber for sputtering and cleaning a surface of the substrate transferred from the heating chamber, a film-forming chamber for forming a thin film on the surface of the substrate by accumulating scattered sputtered particles resulted from sputtering the target, a cooling chamber for cooling the transferred substrate formed with the thin film in the film-forming chamber, and a take-out chamber from which the substrate cooled in the cooling chamber is extracted, wherein the film-forming chamber is provided with an opening portion at one portion thereof, the opening portion is sealed with the target during film formation, a target exchanging chamber is provided adjacently to the film-forming chamber in such a manner that one part of the target exchanging chamber is located at the opening portion of the film-forming chamber, and the target exchanging chamber receiving a spare target therein is communicated with the atmosphere during film formation and evacuated to be maintained in a vacuum state during exchanging the target.

According to the invention, because the target electrode forms one part of the vacuum vessel during film formation, the target is sputtered in the vacuum vessel so that the substrate is formed with a thin film on its surface. Simultaneously, the target exchanging chamber is communicated with the atmosphere for preparing a spare target electrode for exchange. Since the target exchanging chamber is separated from the vacuum vessel by the target electrode even if the target exchanging chamber is communicated with the atmosphere, a vacuum state of the vacuum vessel is never broken. When exchanging the target electrode, the target exchanging chamber is sealed and evacuated. Under such condition, the target electrode forming one part of the vacuum vessel and the spare target for exchange in the target exchanging chamber are transferred by predetermined means so as to be exchanged for each other. When the exchange of the target electrodes is completed, the target exchanging chamber is communicated with the atmosphere and the old target electrode is extracted from the target exchanging chamber as well as a new target electrode for exchange is supplied into the target exchanging chamber for preparing for the next exchange of the targets.

Therefore, the target electrode can be exchanged without communicating the vacuum vessel which is the film-forming chamber with the atmosphere, whereby a film having a preferable quality is formed so that a reliability of the apparatus is increased. Also, because the film-forming chamber is not communicated with the atmosphere, there is little re-startup time of the apparatus, and accordingly, an activity rate of the apparatus is significantly increased.

DESCRIPTION OF THE PREFERRED EMBODIMENTS

The present invention will be fully described hereinafter with reference to preferred embodiments illustrated in the accompanying drawings.

Figure 1:
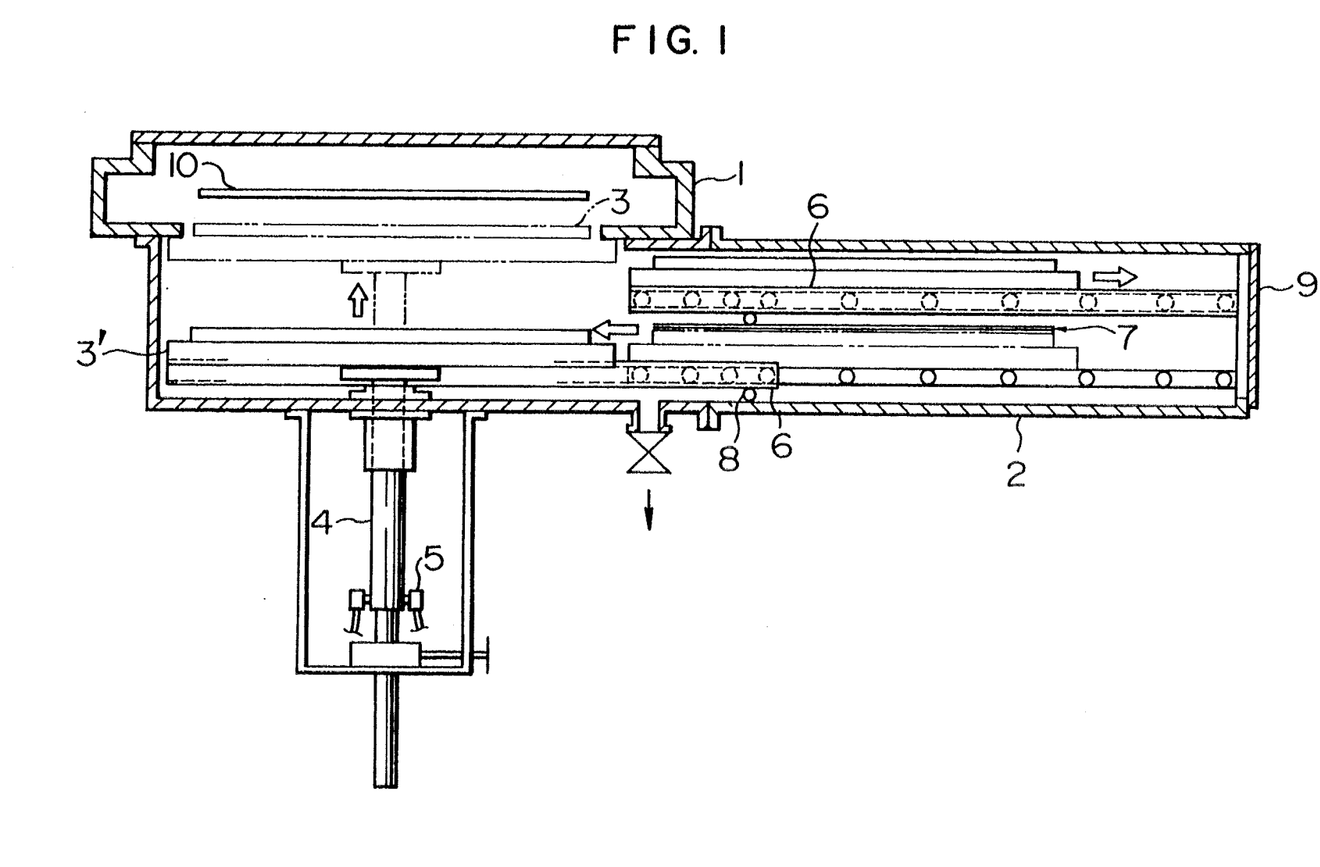
FIG. 1 is a vertically cross-sectional view showing one embodiment of a sputtering apparatus according to the invention.

One embodiments of a sputtering apparatus and a target exchanging devices are shown in FIG. 1.

Referring to FIG. 1, reference numeral 1 designates a vacuum vessel defining a film forming chamber, within which a target electrode 3 forming one part of the vacuum vessel 1 and a substrate tray 10 are disposed. A wall face of the vacuum vessel 1 is formed to be flush with a surface of the target electrode 3. The target electrode 3 is supported by means of a target electrode supporter 4 which includes a cooled water introduction port 5 from which cooled water is supplied. A target electrode exchanging chamber 2 is connected to a lower portion of the vacuum vessel 1, both being adjacent with each other. Two rails 6 for transferring a target electrode are provided within and extend in spaced relation at the up and down sides of the target electrode exchanging chamber 2. The target electrode 3 is displaced when the target electrode transfer rails are moved by transportation gear means 8.

Next, a state of attaching the target electrode 3 will be described in detail with reference to FIG. 2.

Figure 2:
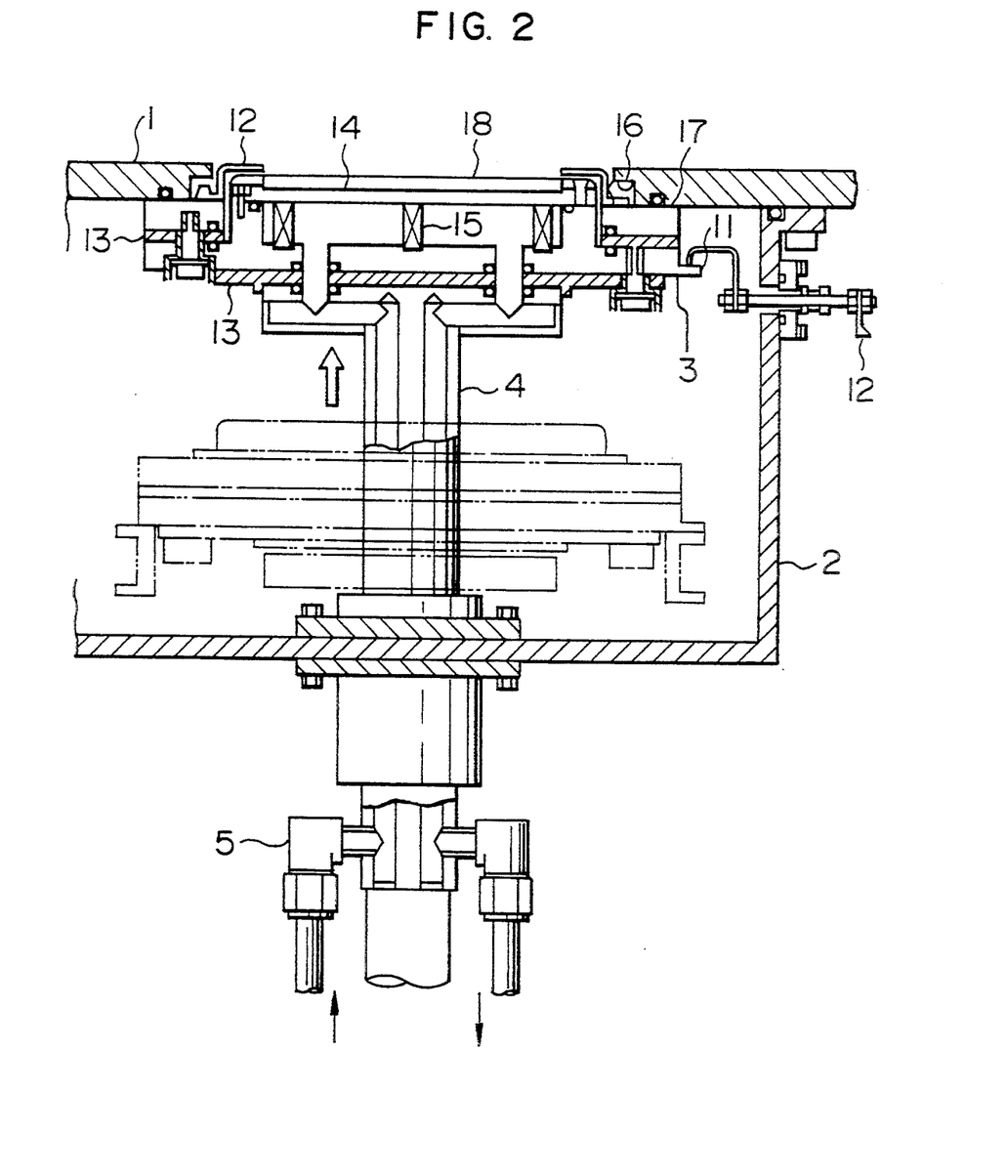
FIG. 2 is an explanatory view illustrating in detail a state attaching target electrode.

As shown in FIG. 2, the target electrode 3 comprises a target 18, a backing plate 14, a magnetic field generating means 15 for generating magnetron magnetic field, an earth plate 17, insulators 13 and earth shields 12, all of which are integrally connected to one another by means of bolts. A target electric potential and an earth electric potential are insulated from each other by the insulators 13. The interior of the vacuum vessel 1 is maintained in vacuum condition by a vacuum sealing portion between the vacuum vessel 1 defining a film-forming chamber and the earth plate 17. The target electrode 3 is automatically connected to an electric connector 11 and an earth connector 16 in a state of being attached to the vacuum vessel 1. Electric power is supplied to the target 18 through electric current introducing terminals 12. The earth connector 16 is forcedly connected to the earth electric potential because it cannot be brought into metal-touch with the vacuum vessel 1 due to interference of O-ring seal interposed between the earth plate 17 and the vacuum vessel 1. Cooled water is supplied through the target electrode supporter 4 to the target electrode 3. The target electrode 3 and the target electrode supporter 4 are separated from each other by the portion of the lower insulator 13. The interior of the target exchanging chamber 2 is normally communicated with the atmosphere and the target electrode 3 is secured to the vacuum vessel 1 in such a manner that it seals an opening portion of the vacuum vessel 1 by pressure differential across the opening and actuation force of the target electrode supporter 4. When the target electrode 3 is exchanged, the target exchanging chamber 2 is evacuated by an exhaust pump (not shown). When the target electrode supporter 4 is lowered after the pressure in the target exchanging chamber 2 is made substantially equal to that in the vacuum vessel 1, the target electrode 3 is disconnected from the vacuum vessel 1 and supported by the transfer rails (not shown in FIG. 2). A method for exchanging the target electrode 3 will now be explained with reference to FIG. 1.

In a state that the target electrode 3 is secured to the vacuum vessel 1, an exchanging door 9 is opened after checking whether the pressure in the target exchanging chamber 2 is generally equal to the atmosphere pressure. A new target electrode 3' to be exchanged is set on the lower transfer rail 6. The exchanging door 9 is closed, prior to evacuating the target exchanging chamber 2. After the evacuation, a target surface of the new target electrode 3' for exchange is heated by a heater 7 in order to extract gas from the new target electrode 3'. Subsequently, the upper transfer rail 6 is moved to a setting location just below the vacuum vessel 1. Under such condition, when the target electrode supporter 4 is lowered, the target electrode 3 also descends together with the supporter. The target electrode 3 is supported on the upper transfer rail 6. The target electrode supporter 4 is further lowered to a position below the transfer rail 6. The disconnected target electrode 3 is moved to the right.

The water in the target electrode 3 is required to be discharged before it is disconnected. The water can be completely removed from the interior of the target electrode 3 by stopping supply of the cooled water and then feeding dry air into the target electrode in place of the cooled water. After that, the air in the electrode is exhausted line order not to allow the atmosphere to enter the target exchanging chamber 2 when the target electrode 3 and in the target electrode supporter 4 are separated from each other.

The disconnected target electrode 3 is moved before the new target electrode 3' to be exchanged is delivered to the position just below the vacuum vessel 1. Then, the target electrode supporter 4 is lifted to secure the target electrode 3' against a predetermined position of the vacuum vessel 1. The interior of the target electrode 3' begins to be cooled again, the pressure in the target exchanging chamber 2 is recovered substantially equal to the atmosphere pressure, and the target electrode 3 is removed out of the target exchanging chamber 2. In this way, the exchanging of the target electrode is completed.

The constitution shown in FIG. 2 illustrates such an example that the target electrode 3 and the earth shields 12 are united with each other so that the earth shields 12 can be exchanged simultaneously when the target electrode is exchanged in such a manner, as explained above with reference to FIG. 1. Similarly, an adhesion-preventing plate which is provided for preventing a sputtering film adhesion may be integrally with the target electrode 3, so that it is made possible to exchange the adhesion-preventing plate without communicating the vacuum vessel 1 which is the film-forming chamber with the atmosphere.

According to the structure shown in FIG. 1, the heater 7 is used in the target exchanging chamber 2 to discharge the gas of the target electrode 3' to be exchanged. However, by providing a pre-sputtering mechanism in the target exchanging chamber 2, it is also possible to clean a target surface of the target electrode 3' within the target exchanging chamber 2 and attach the cleaned target electrode to the vacuum vessel as it is.

Further, referring to FIGS. 1 and 2, the substrate tray is horizontally transferred by way of a sputtering-up example, whereas in a side-sputtering method wherein the substrate tray is transferred vertically, the target electrode can be exchanged without communicating the film-forming chamber with the atmosphere.

Figure 3A:
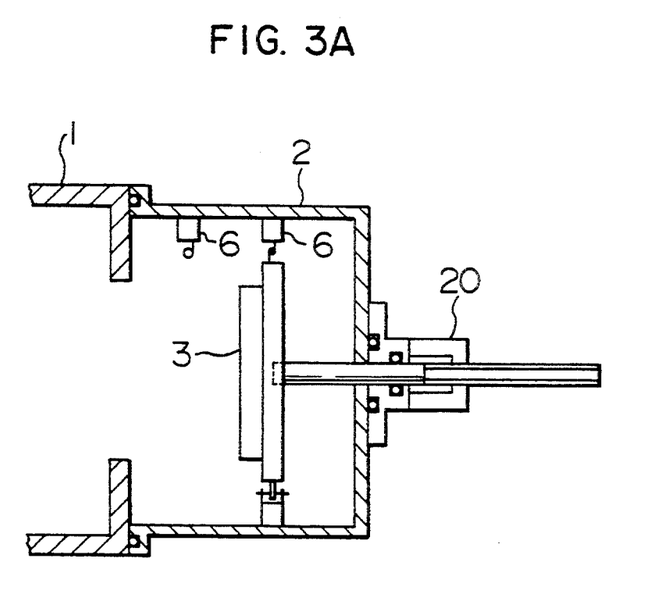
FIG. 3A is a partially cross-sectional view showing one example of the vertically attached target electrode.
Figure 3B:
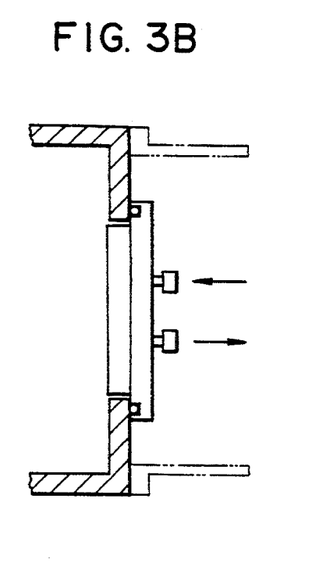
FIG. 3B is a partially cross-sectional view showing a state after the target electrode is exchanged.

The above-described instance can be seen from FIG. 3A. As shown in the drawing, the target electrode 3 conveyed on the transfer rail is attached to the vacuum vessel 1 with a target electrode fixture jig 20. A top end of the fixture jig 20 is formed with screw thread and this threaded top end is screwed into a rear face of the target electrode 3, so that the target electrode can be positioned precisely even when it is vertically attached to the vacuum vessel. FIG. 3B indicates a state that the target electrode 3 is attached to the vacuum vessel 1. In this embodiment, both operations of supplying the cooled water and connecting the electric current flowing portions are executed manually, which differ from the embodiment in FIG. 1. Accordingly, a structure of the target exchanging chamber 2 can be simplified.

As mentioned above, according to the respective embodiments of the invention, because the vacuum vessel which is the film-forming chamber is not communicated with the atmosphere, a film having a good quality can be formed in a stable manner so that reliability of the apparatus is further improved, as well as yield of products is increased. Also, since a period of re-startup time in the apparatus after communication of the film-forming chamber with the atmosphere can be shortened, the activity rate of the apparatus is significantly increased. Further, as one target is enough for one kind of film, the apparatus is not required to be large-sized, and accordingly, the number of power sources and so on can be considerably decreased and the dimensions of the apparatus can thus be reduced.

Figure 4A:
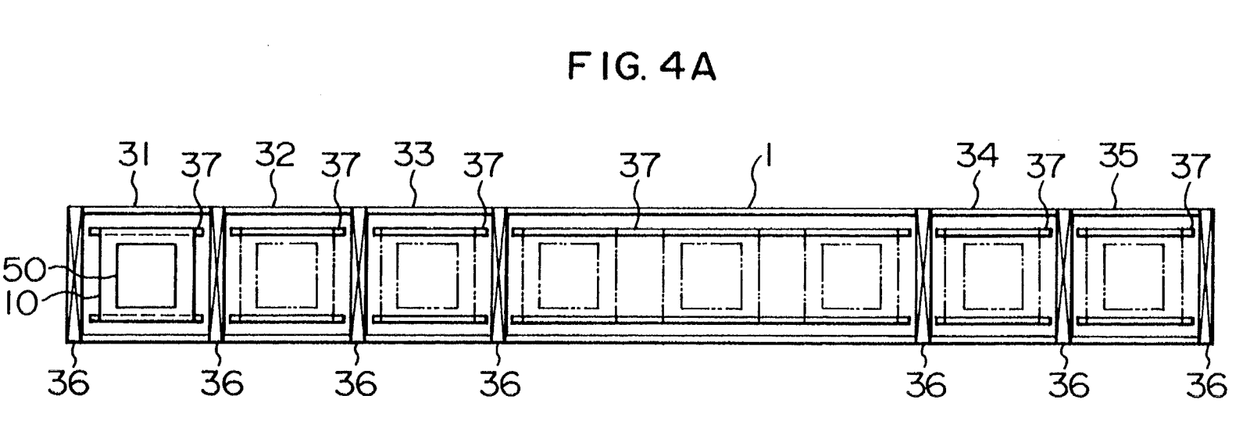
FIG. 4A is a plan view indicating a schematic structure of an in-line sputtering apparatus.
Figure 4B:
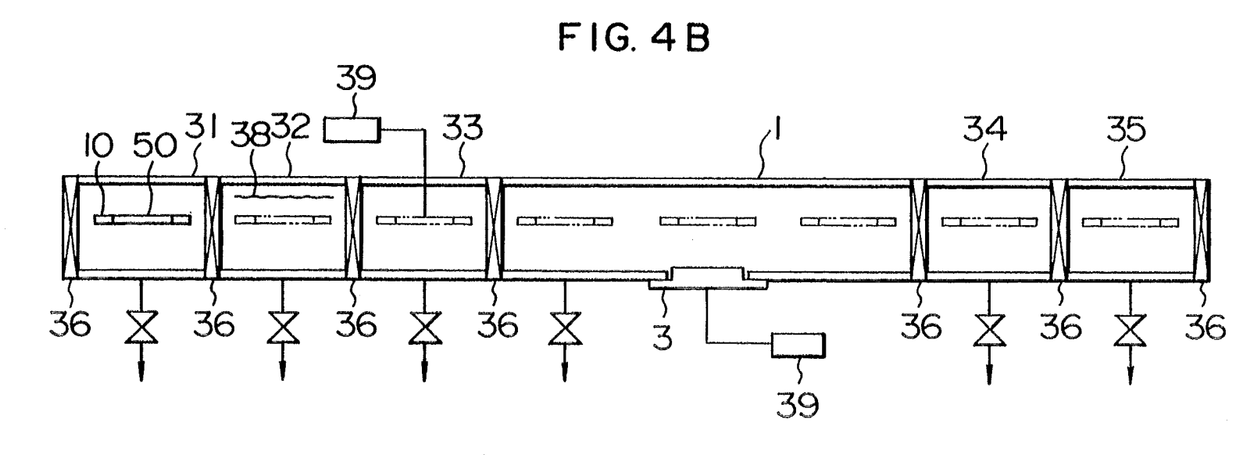
FIG. 4B is a side view of FIG. 4A.

FIGS. 4A and 4B show a structure representative of a vacuum chamber in a normal in-line sputtering apparatus. As shown in the drawings, the in-line sputtering apparatus comprises a supply chamber 31, a heating chamber 32, a sputtering cleaning chamber 33, a film-forming chamber 1, a cooling chamber 34 and a take-out chamber 35. Each vacuum chamber is separated from the adjacent chambers by gate valves 36. The heating chamber 32, the sputtering cleaning chamber 33, the film-forming chamber 1 and the cooling chamber 34 are always maintained in vacuum condition. In case of normal film-formation, the supply chamber 32 is communicated with the atmosphere and a substrate tray 10 on which a substrate 50 is mounted is supplied therein, and the air is exhausted from the supply Chamber 31. After exhausting the air from the supply chamber 31, the gate valve 36 is opened to move the substrate tray 10 into the heating chamber 32 by a transfer mechanism 37. In the heating chamber 32, the substrate is heated by a heater 38 such as a lamp heater or a sheath heater so as to discharge the gas from the substrate. Subsequently, the substrate tray is moved into the sputtering cleaning chamber 33. In the sputtering cleaning chamber 33, high-frequency electric power or direct-current electric power is impressed on the substrate tray 10 through a sputtering power source 39 and a substrate surface is cleaned by sputtering of process gas. Further, the, substrate tray 10 is moved into the film-forming chamber by the transfer mechanism 37 for film-formation. After the film-formation, the substrate tray 10 is displaced to the cooling chamber 34 and then to the take-out chamber 35. When the substrate tray 10 is moved to the take-out chamber 35, the chamber 5 is communicated with the atmosphere and the substrate tray 10 is taken out. The in-line sputtering apparatus is arranged in such a manner that the substrate tray 10 is supplied one after another at a certain interval and film-formation processing is executed continuously.

Figure 5A:
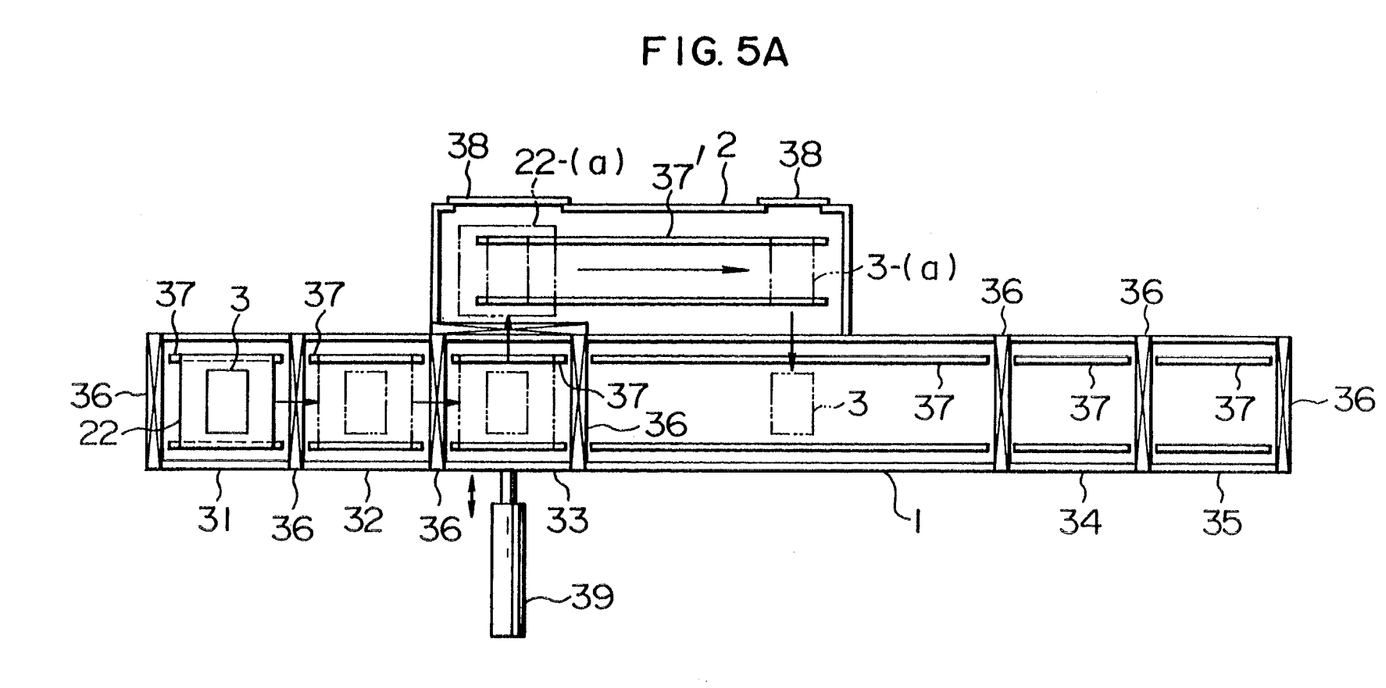
FIG. 5A is a plan view of one embodiment of the in-line sputtering apparatus.
Figure 5B:
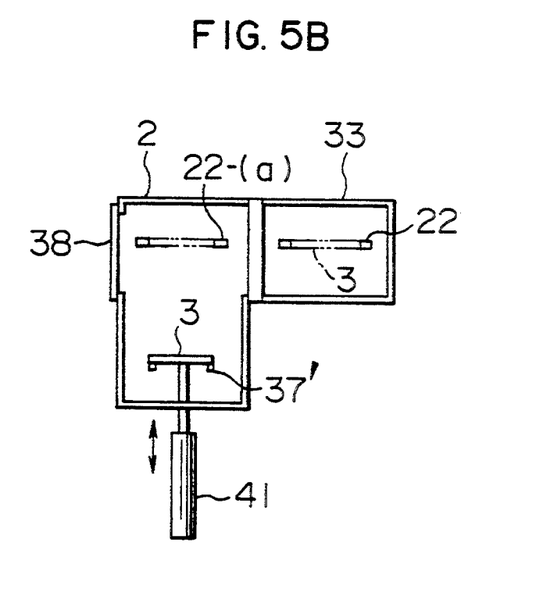
FIG. 5B is a side view of a portion of a target exchanging chamber.

A method for exchanging a target according to the invention in the above structure of the vacuum chambers will be explained hereinafter with reference to FIGS. 5A and 5B.

At first, referring to FIG. 5A, the structure of this embodiment will be described.

In the illustrated embodiment, a target exchanging chamber 2 is provided on the rear faces of the sputtering cleaning chamber 33 and the film-forming chamber 1. The target exchanging chamber 2 is separated from the sputtering cleaning chamber 33 by the gate valve 36, and from the film-forming chamber 1 by the target electrode 3, respectively. The target exchanging chamber 2 is provided with a target holder 22 and doors 38 from which the exchanged target electrode 3 is extracted. While the doors 38 are closed, the target exchanging chamber 2 is evacuated to be brought into a vacuum state by an exhauster (not shown).

In place of the substrate tray 10, the target electrode 3 mounted on the target holder 22 for exclusive use is fed into the supply chamber 31. After exhaustion of the air from the supply chamber 31, the target holder 22 is moved into the heating chamber 32 by means of the transfer mechanism 37. In the heating chamber 32, a target surface of the target electrode 3 is heated for discharging the gas in the target electrode, similarly to the discharge of the gas in the substrate. Subsequently, the target electrode 3 is moved to the sputtering cleaning chamber 33 and the target surface is cleaned, similarly to the cleaning of the substrate surface. After the cleaning, the air in the target exchanging chamber 2 is exhausted and the target exchanging chamber 2 is communicated with the sputtering cleaning chamber 33 by opening the gate valve 36 interposed therebetween. The target electrode 3 is displaced to a position (22-a) in the target exchanging chamber 2 by means of a holder conveyor mechanism 39. After that, the gate valve 736 is closed. As illustrated in FIG. 5B, the target electrode 3 is removed from the target holder 22 by a supporter 41 for the target electrode 3 and is lowered to a position of the transfer mechanism 37', which position is as high as the target attachment level. In the next, the target electrode 3 is conveyed to a rear position (3-a) in, the film-forming chamber 1 by the transfer mechanism 37'. Hereafter, the exchange of the target electrode is executed by procedures similar to those of the embodiment shown in FIG. 1. After the target electrode is exchanged, the target exchanging chamber 2 is opened to the atmosphere and the disconnected target electrode 3 and the target holder 22 are extracted. As mentioned above, the target electrode can be exchanged without communicating the film-forming chamber 1 with the atmosphere.

According to this embodiment, since the gas-discharge and pre-sputtering of the target electrode cannot be executed separately from the film-forming process, the apparatus must stop operating during the gas discharge and pre-sputtering, which results in a reduction of an activity rate of the apparatus. However, there is no necessity of providing a heater for gas discharge, a pre-sputtering mechanism and a pre-sputtering power source in the target exchanging chamber 2 so that cost of manufacturing the apparatus is lowered and the dimensions of the apparatus can be reduced.

Further, another embodiment of the method for exchanging a target in a vacuum state according to the invention, will be described below with reference to FIGS. 6A and 6B.

Figure 6A:
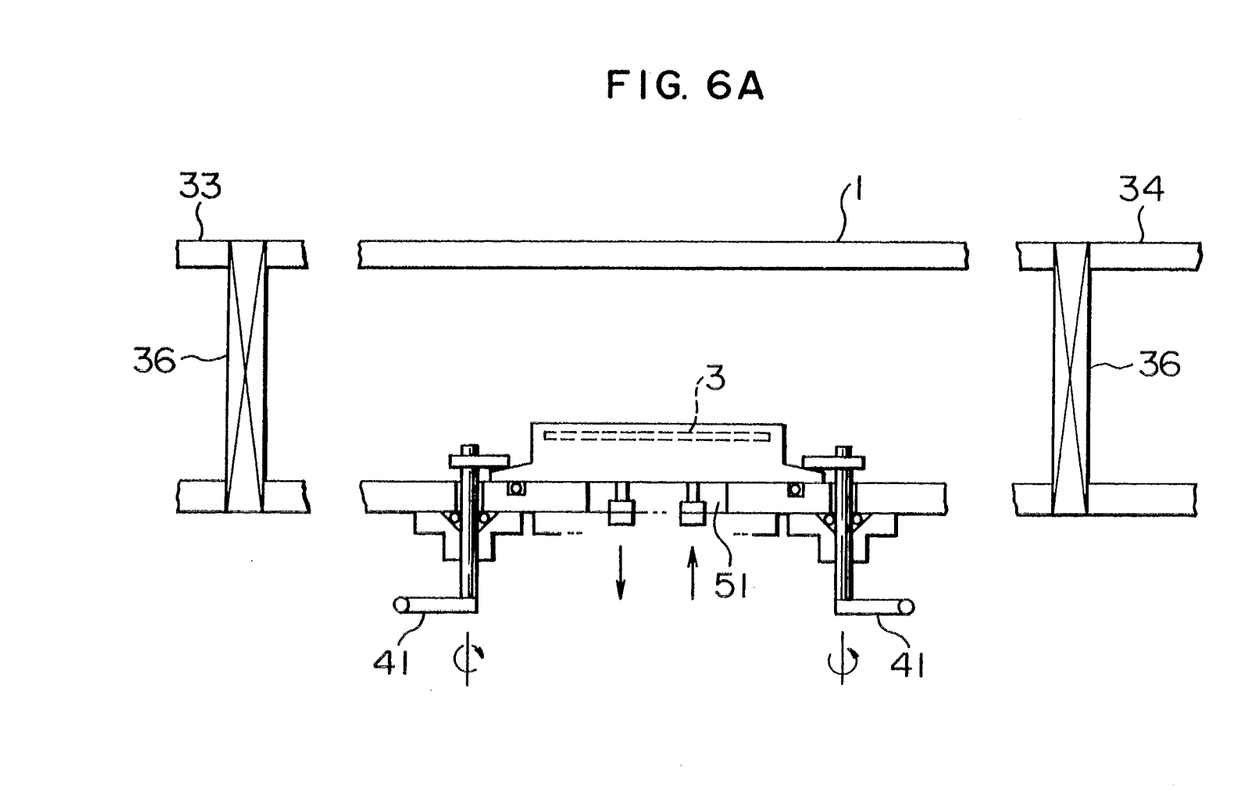
FIG. 6A is a side view illustrating another embodiment of an in-line sputtering apparatus.
Figure 6B:
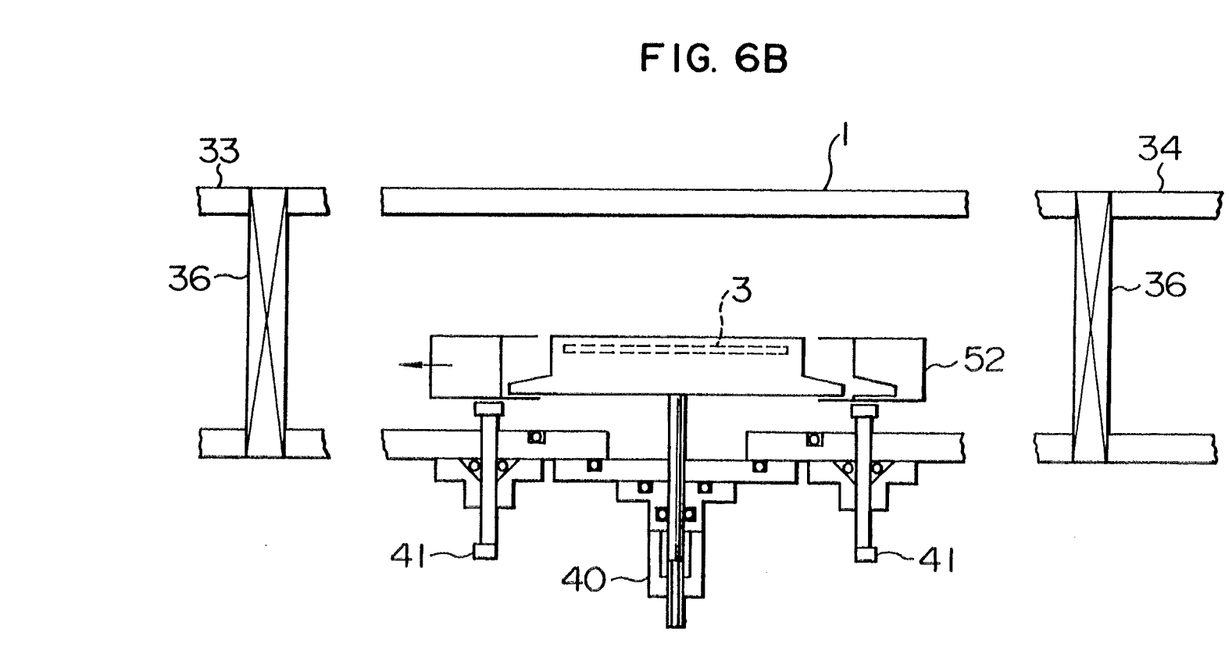
FIG. 6B is a side view similar to FIG. 6A showing a condition of the apparatus after exchanging a target.

FIG. 6A shows a state that the target electrode 3 is secured to the film-forming chamber 1 of the in-line sputtering apparatus illustrated in FIG. 4 by means of a fixture jig 41. During exchanging the target electrode 3, a target exchanging jig 40 is fixed to a rear face of the target electrode 3. The target exchanging jig 40 forms a portion of the wall of the vacuum vessel. After the fixture, the air in a space 51 interposed between the target exchanging jig 40 and the target electrode 3 is exhausted by an exhauster (not shown). Subsequently, the fixture jig 41 is loosened so that the target electrode 3 is supported on the target exchanging jig 40 and separated from the vacuum vessel. As shown in FIG. 5A, the target electrode 3 is successively transferred from the supply chamber 31 to the heating chamber 32, the sputtering cleaning chamber 33 and the film-forming chamber 1 by means of the transfer mechanism 37. The target electrode 3 is mounted on a target holder 52 by the target exchanging jig 40, as illustrated in FIG. 6B. Hereafter, the target exchanging jig 40 is disconnected from the target electrode 3. The target holder 52 on which the target electrode 3 is mounted, is displaced to the cooling chamber 34 and the take-out chamber 35, and it is extracted from the take-out chamber 35.

Next, the target holder 52 on which a new target electrode 3 is mounted, is prepared into the supply chamber 31.

As previously explained with reference to the embodiment of FIGS. 5A and 5B, after the gas of the target electrode is discharged and the target surface is cleaned by sputtering, the target electrode 3 is transferred to the film-forming chamber 1 and is secured thereto through procedures reverse to those during disconnection of the target electrode. After securing the target electrode 3, the target exchanging jig 40 is separated from the target electrode to return it into a condition ready for sputtering.

According to this embodiment, the target exchanging chamber 2 becomes unnecessary, whereby a further decrease in dimension and a cost reduction of the apparatus can be realized.

As described above, in accordance with the invention, the target electrode can be exchanged in a vacuum state without communicating the film-forming chamber with the atmosphere. Therefore, because re-startup time of the apparatus is not necessary, the invention provides such an effect that the activity rate of the apparatus is significantly increased.

What is claimed is:

1. A sputtering apparatus comprising a vacuum vessel; a substrate disposed in said vacuum vessel and formed with a thin film on its surface; and a target electrode which is located opposite to said substrate and which includes a material for film formation; said vacuum vessel being provided with an opening portion on its surface on the side opposite to said substrate, said opening portion being sealed with said target electrode during forming a thin film on said substrate by sputtering said target electrode to accumulate scattered sputtered particles on the surface of said substrate, said vacuum vessel being disposed adjacent to a target electrode exchanging chamber in such a manner that one part of said target electrode exchanging chamber is located at said opening portion of said vacuum vessel, and said target electrode exchanging chamber receiving a spare target electrode therein, communicating with the atmosphere during said film formation, and being evacuated to be maintained in a vacuum state during the exchange of said target electrode.

2. A sputtering apparatus according to claim 1, wherein a heater for heating a surface of a target electrode for exchange, in order to discharge gas from the target, is provided in said target electrode exchanging chamber.

3. A sputtering apparatus according to claim 1, wherein a pre-sputtering mechanism for cleaning a surface of a target electrode for exchange, is provided in said target electrode exchanging chamber.

4. A sputtering apparatus according to claim 2, including a vertically movable target electrode supporter for supporting the target electrode at the position of said film-forming chamber, lowering said target electrode to mount it on an upper target electrode transfer rail provided in said target electrode exchanging chamber when exchanging the target electrode, and supporting a target electrode for exchange and transfer by a lower target electrode transfer rail to lift said target electrode to a predetermined position in said film-forming chamber.

5. A sputtering apparatus including a vacuum vessel; a substrate disposed in said vacuum vessel and formed with a thin film on its surface; and a target electrode which comprises a target plate which is located opposite to said substrate, said target plate being a material for film formation, a magnetic field generating means provided on a rear face of the target plate for forming a magnetic field on a surface of said target plate, and a cooled water introducing section for cooling said target plate; said vacuum vessel being provided with an opening portion on its wall face on the side opposite to said substrate; said opening portion being sealed with said target electrode; said vacuum vessel being adjacent to a target electrode exchanging chamber in such a manner that one part of said target electrode exchanging chamber is positioned at the opening portion of said vacuum vessel; and said target electrode exchanging chamber receiving therein a spare target electrode which comprises a target plate, a magnetic field generating means and a cooled water introducing section, being communicated with the atmosphere during forming a thin film on the substrate by sputtering said target electrode to thus accumulate scattered sputtered particles on the surface of said substrate and evacuated to be maintained in a vacuum state during exchanging the target electrode.

6. A method for exchanging a target electrode, wherein said target electrode comprises a target plate which is a material for forming a thin film on a substrate by accumulating scattered particles by sputtering on a surface of the substrate in a vacuum vessel, comprising the steps of: providing a magnetic field generating means on a rear face of the target plate for forming a magnetic field on a surface of said target plate, providing a cooled water introducing section for cooling the target plate, said target electrode defining one part of said vacuum vessel during the film formation, providing a target electrode exchanging chamber adjacently to said vacuum vessel which is evacuated into a vacuum state, and said target electrode defining one part of said vacuum vessel, is exchanged for a spare target electrode which comprises a target plate, a magnetic field generating means, and a cooled water introducing section, said target electrode being previously received in said target electrode exchanging chamber.

7. An in-line sputtering apparatus comprising a supply chamber which is evacuated after a substrate is supplied therein under a condition that the interior thereof is communicated with the atmosphere; a heating chamber for heating said substrate transferred from said supply chamber by a transfer mechanism after evacuation of the supply chamber, by a heating device provided in said heating chamber, in order to discharge gas in the substrate; a cleaning chamber for sputtering and cleaning a surface of said substrate transferred from said heating chamber; a film-forming chamber for forming a thin film on the surface of said substrate transferred from said cleaning chamber by accumulating scattered particles resulted from sputtering a target of a target electrode on the substrate surface; a cooling chamber for cooling the substrate formed with a thin film on its surface and transferred from said film-forming chamber; and a take-out chamber from which the substrate cooled in said cooling chamber is extracted; said film-forming chamber being provided at one portion thereof with an opening portion which is sealed with said target electrode during film formation, said film-forming chamber being adjacently provided with a target electrode exchanging chamber in such a manner that one part of said target electrode exchanging chamber is located at the opening portion of said film-forming chamber, and said target electrode exchanging chamber receiving a spare target electrode therein, being communicated with the atmosphere during film formation and evacuated so as to be maintained in as vacuum state during exchanging the target electrode.

8. An in-line sputtering apparatus comprising a supply chamber which is evacuated after a substrate is supplied therein under a condition that the interior thereof is communicated with the atmosphere; a heating chamber for heating with a heating device said substrate transferred from said supply chamber by a transfer mechanism after evacuation of said supply chamber, in order to discharge gas in the substrate; a cleaning chamber for sputtering and cleaning a surface of said substrate transferred from said heating chamber; a film-forming chamber for forming a thin film on the surface of said substrate transferred from said cleaning chamber by accumulating scattered particles resulted from sputtering a target of a target electrode on the substrate surface; a cooling chamber for cooling the substrate formed with a thin film on its surface and transferred from said film-forming chamber; and a take-out chamber from which the substrate cooled in said cooling chamber is taken out; said cleaning chamber and said film-forming chamber being provided with a target electrode exchanging chamber on their rear faces; and said target electrode exchanging chamber being separated from said cleaning chamber by a gate valve and from said film-forming chamber by said target electrode.

9. An in-line sputtering apparatus according to claim 8, wherein said target electrode exchanging chamber is provided with a target electrode holder and doors through which said target after exchanged is extracted.

10. A method for exchanging a target electrode in an in-line sputtering apparatus comprising the steps of: supplying a target electrode mounted on a target electrode holder into a supply chamber; transferring said target electrode holder into a heating chamber by a transfer mechanism after evacuating said supply chamber in order to heat a target electrode surface in said heating chamber for discharging gas in the target electrode, and gas-discharging a substrate; cleaning the surface of the target electrode transferred into a sputtering cleaning chamber after the gas-discharging, and cleaning the substrate; evacuating a target electrode exchanging chamber after the cleaning of the target electrode surface and opening a gate valve between the target electrode exchanging chamber and the sputtering cleaning chamber to convey the target electrode into the target electrode exchanging chamber; closing the gate valve after the conveyance of the target electrode and disconnecting the target electrode from the target electrode holder so as to lower the target electrode to a position as high as a target electrode attachment level; moving the target electrode to the rear side of a film-forming chamber in order to exchange the target electrode; and communicating the target electrode exchanging chamber with the atmosphere after exchanging the target electrode and extracting the disconnected target electrode and the target electrode holder from the target electrode exchanging chamber without communicating said film forming chamber with the atmosphere.

11. A method for exchanging a target electrode in an in-line sputtering apparatus comprising the steps of: supplying a target electrode holder into a supply chamber; after evacuating said supply chamber, displacing the target electrode holder from the supply chamber to a heating chamber, a cleaning chamber and a film-forming chamber successively by a transfer mechanism; attaching to said film-forming chamber a target electrode exchanging jig which maintain said film-forming chamber in a vacuum state during exchanging the target electrode in said film-forming chamber as well as to secure the target electrode to the target electrode holder; securing the target electrode to said target electrode holder by means of said target electrode exchanging jig; transferring said target electrode holder on which said target electrode is mounted from the film-forming chamber to a cooling chamber and a take-out chamber by the transfer mechanism so as to extract said target electrode from said take-out chamber; supplying the target electrode mounted on the target electrode holder into said supply chamber; after evacuating said supplying chamber, conveying the target electrode holder from the supply chamber to the heating chamber by the transfer mechanism and heating a surface of the target electrode in said heating chamber for discharging gas in the target electrode, and gas-discharging a substrate; displacing the target electrode to a sputtering cleaning chamber after gas-discharging of the target electrode to clean the target electrode surface, and the cleaning of the substrate; moving the target electrode into the target electrode exchanging chamber after cleaning the target electrode surface; disconnecting the target electrode from the target electrode holder after the movement of the target electrode, to secure the target electrode to the film-forming chamber by means of the target electrode exchanging jig; displacing only said target electrode holder to the cooling chamber and the take-out chamber, for extracting the target electrode holder from the take-out chamber; and disconnecting said target electrode exchanging jig from the film-forming chamber.

* * * * *